(12) United States Patent
DiStefano et al.

(10) Patent No.: US 6,706,973 B2
(45) Date of Patent: Mar. 16, 2004

(54) ELECTRICAL CONNECTION WITH INWARDLY DEFORMABLE CONTACTS

(75) Inventors: Thomas H. DiStefano, Monte Sereno, CA (US); Joseph Fjelstad, Maple Valley, WA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/200,941

(22) Filed: Jul. 23, 2002

(65) Prior Publication Data

US 2002/0179325 A1 Dec. 5, 2002

Related U.S. Application Data

(62) Division of application No. 09/779,117, filed on Feb. 8, 2001, which is a division of application No. 08/989,305, filed on Dec. 12, 1997, now Pat. No. 6,247,228.
(60) Provisional application No. 60/032,884, filed on Dec. 13, 1996.

(51) Int. Cl.[7] .................................................. H05K 1/16
(52) U.S. Cl. ...................... 174/260; 174/263; 174/266
(58) Field of Search ............................ 174/260–266; 439/66–67; 29/830–831; 361/778, 790, 803

(56) References Cited

U.S. PATENT DOCUMENTS

| | | |
|---|---|---|
| 3,190,953 A | 6/1965 | Keller |
| 3,316,618 A | 5/1967 | Guarracini |
| 3,316,619 A | 5/1967 | Beelitz |
| 3,509,270 A | 4/1970 | Dube et al. |
| 3,541,222 A | 11/1970 | Parks et al. |
| 3,616,532 A | 12/1971 | Beck |
| 3,739,469 A | 6/1973 | Dougherty, Jr. |
| 3,795,037 A | 3/1974 | Luttmer |
| 3,862,790 A | 1/1975 | Davies et al. |
| 3,904,934 A | 9/1975 | Martin |
| 4,074,342 A | 2/1978 | Honn et al. |
| 4,225,900 A | 9/1980 | Ciccio et al. |
| 4,249,302 A | 2/1981 | Crepeau |
| 4,528,072 A | 7/1985 | Kurosawa et al. |
| 4,548,451 A | 10/1985 | Benarr et al. |
| 4,655,519 A | 4/1987 | Evans et al. |
| 4,685,210 A | 8/1987 | King et al. |
| 4,695,870 A | 9/1987 | Patraw |
| 4,716,049 A | 12/1987 | Patraw |
| 4,729,809 A | 3/1988 | Dery et al. |
| 4,788,766 A | 12/1988 | Burger et al. |
| 4,793,814 A | 12/1988 | Zifcak et al. |
| 4,902,606 A | 2/1990 | Patraw |
| 4,924,353 A | 5/1990 | Patraw |
| 4,954,878 A | 9/1990 | Fox et al. |
| 5,037,312 A | 8/1991 | Casciotti |
| 5,047,830 A | 9/1991 | Grabbe |
| 5,129,142 A | 7/1992 | Bindra et al. |
| 5,131,852 A | 7/1992 | Grabbe et al. |
| 5,142,775 A | 9/1992 | Wiley |
| 5,152,695 A | 10/1992 | Grabbe et al. |
| 5,167,512 A | 12/1992 | Walkup |
| 5,173,055 A | 12/1992 | Grabbe |

(List continued on next page.)

Primary Examiner—Evan Pert
Assistant Examiner—Tuan Dinh
(74) Attorney, Agent, or Firm—Lerner, David, Littenberg, Krumholz & Mentlik, LLP

(57) ABSTRACT

An interposer for interconnection between microelectronic circuit panels has contacts at its surfaces. Each contact extends from a central conductor, and has a peripheral portion adapted to contract radially inwardly toward the central conductor response to a force applied by a contact pad defining a central hole on the engaged circuit panel. Thus, when the circuit panels are compressed with the interposers, the contacts contract radially inwardly and wipe across the pads. The wiping action facilitates bonding of the contacts to the pads, as by friction welding, or by a conductive bonding material carried on the contacts themselves.

59 Claims, 8 Drawing Sheets

U.S. PATENT DOCUMENTS

| | | |
|---|---|---|
| 5,224,265 A | 7/1993 | Dux et al. |
| 5,228,861 A | 7/1993 | Grabbe |
| 5,232,548 A | 8/1993 | Ehrenberg et al. |
| 5,282,312 A | 2/1994 | DiStefano et al. |
| 5,430,614 A | 7/1995 | Difrancesco |
| 5,432,677 A | 7/1995 | Mowatt et al. |
| 5,590,460 A | 1/1997 | DiStefano et al. |
| 5,632,631 A | 5/1997 | Fjelstad et al. |
| 5,666,270 A | 9/1997 | Matsuda et al. |
| 5,736,679 A | 4/1998 | Kresge et al. | though the dielectric sheet in both directions. Such a sheet may be
ELECTRICAL CONNECTION WITH INWARDLY DEFORMABLE CONTACTS

CROSS REFERENCE TO RELATED APPLICATIONS

This application is a divisional of U.S. patent application Ser. No. 09/779,117, filed Feb. 8, 2001, which application is a divisional of U.S. patent application Ser. No. 08/989,305, filed Dec. 12, 1997, now U.S. Pat. No. 6,247,228, which claims the benefit of U.S. Provisional Patent Application Ser. No. 60/032,884, filed Dec. 13, 1996, which applications are hereby incorporated by reference in their entirety herein.

BACKGROUND OF THE INVENTION

The present invention relates to the field of electrical circuitry, and more particularly relates to layered circuit structures such as multilayer circuit boards, to components and methods utilized in fabrication of such structures and to methods of making the same.

Electrical components are commonly mounted on circuit panel structures such as printed circuit boards. Circuit panels ordinarily include a generally flat sheet of dielectric material with electrical conductors disposed on a major, flat surface of the sheet or on both major surfaces. The conductors are commonly formed from metallic materials such as copper and serve to interconnect the electrical components mounted to the board. Where the conductors are disposed on both major surfaces of the panel, the panel may have via conductors extending through the dielectric layer so as to interconnect the conductors on opposite surfaces. Multilayer circuit panel assemblies have been made heretofore which incorporate plural, stacked circuit panels with additional layers of dielectric materials separating the conductors on mutually facing surfaces of adjacent panels in the stack. These multilayer assemblies ordinarily incorporate interconnections extending between the conductors on the various circuit panels in the stack as necessary to provide the required electrical interconnections.

Electrical components which can be mounted to circuit panel structures include so-called "discrete" components and integrated circuits which include numerous transistors on a single chip. Chips of this nature can be mounted to elements commonly referred to as "chip carriers" which are specialized circuit panel structures. A chip carrier may be incorporated in a package which is mounted to a larger circuit board and interconnected with the remaining elements of the circuit. Alternatively, the chip can be mounted directly to the same circuit panel which carries other components of the system. This arrangement is ordinarily referred to as a "hybrid circuit". Relatively large circuit panels are commonly made of polymeric materials, typically with reinforcement such as glass, whereas very small circuit panels such as those used as semiconductor chip carriers may be formed from ceramics, silicon or the like.

There have been increasing needs for circuit panel structures which provide high density, complex interconnections. These needs are addressed by multilayer circuit panel structures. The methods generally used to fabricate multilayer panel structures have certain serious drawbacks. Multilayer panels are commonly made by providing individual, dual sided circuit panels with appropriate conductors thereon. The panels are then laminated one atop the other with one or more layers of uncured or partially cured dielectric material, commonly referred to as "prepregs" disposed between each pair of adjacent panels. Such a stack ordinarily is cured under heat and pressure to form a unitary mass. After curing, holes are drilled through the stack at locations where electrical connections between different boards are desired. The resulting holes are then coated or filled with electrically conductive materials, typically by plating the interiors of the holes to form what is called a plated through hole.

It is difficult to drill holes with a high ratio of depth to diameter. Thus, the holes used in assemblies fabricated according to these prior methods must be relatively large and hence consume substantial amounts of space in the assembly. These holes ordinarily extend from the top or bottom of the stack. Even where interconnections are not required in the top or bottom layers, space must be provided for holes to pass through these layers so as to provide needed interconnections in the middle layers. Accordingly, substantial amounts of the available surface area on the panels must be allocated to the holes and to accommodate tolerance zones around the holes. Moreover, the electrical interconnections formed by depositing conductive materials in such drilled holes tend to be weak. The drilling method and the general nature of the laminates used therein is described, for example in Doherty, Jr., U.S. Pat. No. 3,793,469; and Guarracini, U.S. Pat. No. 3,316,618.

Various alternative approaches have been proposed. Parks, et al., U.S. Pat. No. 3,541,222; Crepeau, U.S. Pat. No. 4,249,032; Luttmer, U.S. Pat. No. 3,795,037; Davies, et al., U.S. Pat. No. 3,862,790, Fox, U.S. Pat. No. 4,954,878, and Zifcak, U.S. Pat. No. 4,793,814 all relate generally to structures which have metallic or other conductive elements arranged at relatively closely spaced locations on a dielectric sheet with the conductive elements protruding through the dielectric sheet in both directions. Such a sheet may be sandwiched between a pair of circuit boards and the circuit boards may be clamped or otherwise held together so as to provide mechanical engagement between conductive elements on the adjacent faces of the circuit boards and the conductive elements of the composite sheet. In each of these arrangements, the conductive elements, the composite sheet or both is resilient or malleable so as to provide for close engagement between the conductive elements of the composite sheet and the conductors on the circuit boards.

Beck, U.S. Pat. No. 3,616,532 and Dube, et al., U.S. Pat. No. 3,509,270 describe variants of this approach in which resilient elements are used with a fusible solder. These elements are mounted on insulating boards which are then stacked between printed circuit layers. The assembly is heated so as to melt the solder, thereby freeing the resilient elements so that the resilient elements and solder cooperatively form an interconnection between the adjacent circuit boards.

Evans, et al, U.S. Pat. No. 4,655,519 describes a connector with numerous strip-like contact springs disposed in holes in a flat dielectric body, together with other spring elements. The ends of the strips protrude from opposite surfaces of the body. These are adapted to compress when electronic elements are engaged with the body surfaces, so that the ends of the strips engage pads on the electronic elements. Walkup, U.S. Pat. No. 5,167,512 discloses a further system using springs disposed in holes in a dielectric body.

Grabbe, U.S. Pat. No. 5,228,861 describes a connector having a sheet-like dielectric body with numerous generally X-shaped spring contact elements, each having four arms, lying on a first side of the sheet. Two arms of each X-shaped element are bent inwardly toward the sheet, and extend through holes in the sheet so that the tips of these arms protrude above the second, opposite face of the sheet. The other two arms are bent away from the sheet, and hence protrude from the first surface. When the connector is placed between circuit panels, each X-shaped element is compressed between mating pads of the circuit panels, causing the bent arms to flatten and causing the tips of the arms to wipe the surfaces of the pads. After engagement, the contact is maintained by the resilience of the arms.

Bernarr, et al., U.S. Pat. No. 4,548,451 describes a connector or interposer having a sheet-like elastomeric body with crushable protrusions extending outwardly from oppositely-directed surfaces. Tabs formed from a metal-coated flexible film extend on both surfaces of the body, and overlie the protrusions. The tabs on opposite sides are connected to one another by vias. When the interposer is engaged between circuit panels, the tabs and posts are crushed between contact pads on opposing panels, and the tabs assertedly wipe the pads for more effective contact. The tabs are maintained in engagement with the pads by the resilience of the elastomeric sheet and the posts; there is no permanent bond formed.

Patraw, U.S. Pat. Nos. 4,716,049; 4,902,606; and 4,924,353 describe microelectronic connection schemes using deformable contacts protruding upwardly from a substrate. Each contact has a dome-like tip and a plurality of legs extending downwardly from the tip to the substrate. These contacts are formed by selective deposition of aluminum on pedestals of a fugitive material such as potassium chloride or a photoresist using a shaped mask. The pedestals are removed after deposition.

Dery, et al., U.S. Pat. No. 4,729,809 discloses the use of an anisotropically conductive adhesive material disposed between opposing sublaminates, the adhesive composition having sufficient conductivity across the relatively small spaces between conductors on adjacent layers to form an electrical interconnection therebetween, but having low conductivity across the relatively large spaces between adjacent conductors on the same surface so that it does not produce an unwanted lateral interconnection along one surface.

Berger, et al., U.S. Pat. No. 4,788,766 uses conductor bearing circuit lamina having hollow, eyelet-like via structures, each such via structure having a rim protruding vertically from the surrounding structure. Each such via structure is provided with a thin layer of a conductive bonding material. In making the multilayer structure, dielectric bonding films are interposed between the circuit bearing lamina. The dielectric films have apertures in locations corresponding to the locations of the eyelet structures, in the adjacent circuit bearing lamina. Thus, the upstanding rims of the eyelet structures can bear upon one another when the assembly is forced together under heat and pressure. The layers of conductive bonding material on the rims of the abutting eyelets are said to form bonds between the abutting eyelet structures.

Co-pending U.S. patent application Ser. No. 08/277,366 of Thomas H. DiStefano, et al., which is assigned to the same assignee as the present application, discloses an interposer having deformable contacts protruding upwardly from its surfaces. Each contact has a central axis normal to the surface and a peripheral portion adapted to expand radially outwardly from the central axis in response to a force applied by a pad on an engaged circuit panel. Thus, when the circuit panels are compressed with the interposers, the contacts expand radially and wipe across the pads. The wiping action facilitates bonding of the contacts to the pads, as by conductive bonding material carried on the contacts themselves.

Other structures for forming multilayer electronic assemblies are taught in Dux, et al., U.S. Pat. No. 5,224,265 and Ehrenberg, et al., U.S. Pat. No. 5,232,548, which use sublaminates made by depositing a dielectric material onto a perforated metal sheet, as by vapor-phase polymerization or electrophoretic bonding, to form a dielectric sheet with vias. The vias are filled with a flowable joining material such as a metal-loaded polymer. These structures are stacked and heated to join the vias into unitary vertical conductors.

Other multilayer assembly systems using flowable conductive materials to join structures in stacked elements are disclosed in Bindra, et al., U.S. Pat. No. 5,129,142. Still further improvements are disclosed in U.S. Pat. No. 5,282,312 of Thomas H. DiStefano, et al. The '312 patent discloses as background certain lamination techniques or methods of making multilayer circuit assemblies using flowable conductive materials.

Despite these and other efforts in the art, there are needs for still further improvement.

SUMMARY OF THE INVENTION

The present invention addresses these needs.

One aspect of the present invention provides an interposer for making connections to electrical contact pads on a surface of a microelectronic element, such as a circuit panel, a semiconductor chip or other element having a contact bearing surface. The contacts define holes therein. The interposer includes a body having a first major surface, such that the body has horizontal directions parallel to the first major surface and vertical directions perpendicular to the first major surface. The interposer further has a plurality of conductors in the body, such as via conductors extending in or through the body. The interposer further has a plurality of contacts on or above the first major surface. Each of the contacts is permanently joined to one of the conductors, and extends radially outwardly from the conductor. Thus, each contact extends in a plurality of horizontal directions away from the conductor. Each contact has a periphery remote from the conductor and a central portion attached to the conductor. The contacts are adapted to deform so that the periphery of the contact will contract radially inwardly toward the central portion of the contact in response to urging the periphery of the contact against one of the contact pads on the surface of the microelectronic element, and inserting the central portion of the contact into the hole defined by the contact pad. As the microelectronic element is juxtaposed with the first surface of the interposer and forced toward the body, the contacts will wipe the contact pads of the microelectronic element. The wiping action removes oxides and other contaminants from the mating surfaces to provide an effective, low resistance electrical connection between the pads and the contacts and, in preferred embodiments, to facilitate bonding of the contacts and the pads.

The contacts are desirably arranged to deform so that the contact bends vertically downward, with the periphery of the contact moving toward the body, as well as contracting radially inwardly toward the central portion of the contact. In the initial, undeformed condition, the periphery of each contact may be spaced vertically above the body, with a gap between the periphery of the contact and the body. The body may be deformable at least near the periphery of each of the contacts, such that movement of the periphery downwardly causes the periphery to engage and deform the body. The body may have an adhesive layer covering the first major surface for adhering the interposer to the microelectronic element upon juxtaposition of the two components. The contacts may be disposed on the adhesive layer, and the adhesive layer may have a thickness beneath the contacts greater than the thickness of the adhesive layer between the contacts. Such a configuration supports the contacts during handling, while maintaining the contact in an extended position for assuring contact with contact pads on an adjacent microelectronic element.

The periphery of each of the contacts may be noncircular. For example, each of the contacts may include a plurality of tabs extending radially outwardly from the conductor, with each of the tabs having a tip remote from the conductor. The tabs of each contact may be disposed in a substantially symmetrical pattern about the juncture of the contact and the associated conductor. The contact may include four such tabs, in which case the substantially symmetrical pattern in a quatrefoil pattern. The contacts may be disposed in a substantially rectilinear grid having rows and columns, the individual tabs extending substantially diagonally with respect to the row and columns. The diagonal tabs permit a maximum contact density for a given tab size. The contacts may take other forms. For example, the tabs may be disposed in a star pattern with the tips of the tabs having a circumferential width less than a circumferential width of the tabs near the central portion. In this case, the tips may be pointed so as to enhance wiping between the contacts and the contact pads. Alternatively, the circumferential width of the tabs near the tips may be greater than the circumferential width near the central portion. Such a configuration promotes wiping along the edges of the contacts.

The contact may include a conductive bonding material adapted to facilitate electrical joining of the tabs to contact pads engaged with the tabs. The conductive bonding material may be selected from the group consisting of solders, brazing alloys, defusion bonding alloys and conductive materials incorporating a polymer.

The contact may be formed integrally with an associated conductor. The conductor may extend substantially perpendicularly to the first surface of the body. The conductors may be arranged in the body at a pitch of less than about 1 mm from center to center. The pitch may therefore be chosen to correspond to standard pitches used in present and future microelectronic element contact arrays.

The interposer may be two-sided. In that case, the body defines a second major surface facing in an opposite direction from the first major surface. At least some of the conductors are through conductors having first ends disposed adjacent to the first major surface and second ends disposed adjacent to the second major surface. At least some of the contacts are permanently joined to the first ends of the through conductors. Second end contacts are provided on or above the second major surface of the body, and are permanently joined to the second ends of the conductors. Each of the second end contacts extends radially outwardly from the associated conductor, and has a periphery remote from the conductor. Each of the second end contacts is adapted to deform so that the periphery of the contact will contract radially inwardly toward the central portion of the contact in response to engaging a second microelectronic element. The element is engaged by urging a periphery of the contact against a contact pad of the second microelectronic element and inserting the central portion of the contact into a hole defined by the contact pad. Upon engagement, the contacts wipe the contact pads of the second microelectronic element when the second microelectronic element is juxtaposed with the second surface and forced toward the body.

In another embodiment of the invention, an interposer is provided for making connections to a microelectronic element having pads defining holes therein. The interposer includes an interposer body having a first surface and a plurality of contacts on the body. Each of the contacts has a central portion extending through the first surface into the body, and a peripheral portion extending radially from the central portion on or above the first surface. The peripheral portion of each contact is adapted to bend downward toward the body. The central portion is adapted to remain substantially undeformed in response to a force on the peripheral portion directed downward toward the body.

The central portions of the contacts may be substantially cylindrical. The peripheral portions may include a plurality of tabs extending radially from the central portion. The interposer may further include a deformable layer between the first surface and the peripheral portions of the contacts to allow the peripheral portions to bend downward into the deformable layer upon engagement with the contact pads on the microelectronic element. The deformable layer supports the contacts during transport, while permitting them to deflect upon engagement. The deformable layer may be an adhesive layer. The peripheral portion of the contact may be spaced apart from the body, defining a gap therebetween.

In another embodiment of the invention, an interposer for making connections to electrical contact pads on a surface of a microelectronic element is provided. The interposer includes an interposer body have a first surface and a plurality of contacts on the body. Each of the contacts includes a central portion and a plurality of tabs extending radially outward from the central portion. Each of the tabs extends over the first surface, and is adapted to deform radially inward toward the central portion of the contact, in response to a force on the tab directed downward toward the body. The tabs may have asperities on top surfaces facing upward away from the body. The asperities engage and wipe a contact pad engaged with the contact, breaking through any oxidation that may be present on the contact pad in order to form a more reliable electrical contact.

In a method for making a multilayer circuit according to the present invention, a circuit panel and an interposer are stacked so that a first surface of the interposer confronts a surface of the panel. The interposer has a body defining the first surface, and conductors having ends adjacent or above the first surface. The interposer further has contacts on the conductor ends, including peripheral portions extending generally horizontally from the associated conductor ends. The peripheral portions of the contacts confront contact pads on the circuit panel. The contact pads on the circuit panel define holes facing the interposer.

The method further comprises the step of compressing the stacked panel and the interposer together. In this step, conductor ends enter the holes in the circuit panel, while the peripheral portions of the contacts are forcibly engaged with the contact pads. This causes the peripheral portion of each contact to be contracted radially inward toward the associated conductor end so that each peripheral portion moves horizontally with respect to the engaged contact pad, and wipes the contact pad.

The conductor ends in the interposer used in the method have a vertical position with respect to the first surface of the interposer. That vertical position remains substantially unchanged during the compressing step. Further, the compressing step may be performed so that the peripheral portion wipes the contact pad at an edge of the contact pad defining the hole. In that case, the peripheral portion may comprise a plurality of tabs extending radially outward from the conductor. The tabs have edges extending in a substantially radial direction, the edges of the tabs wiping the edges of the holes during engagement.

The holes in the contact pads used in the method may be circular or may alternatively be polygonal, in which case they are defined by a plurality of edges wherein adjacent ones of the edges form a plurality of vertices. Where the holes are polygonal, the peripheral portion of an adjoining contact may form a circular outer edge having a diameter larger than a minimum diameter of the polygonal hole. The circular outer edge wipes the edges defining the polygonal hole. The peripheral portion of the contact may alternatively have a plurality of tabs, each of the tabs corresponding to a single vertice of the polygonal hole. The tabs are aligned with the vertices so that during the compressing step, each tab wipes two adjacent edges of the hole.

The contact pad may be connected to a conductive via formed in the hole defined by the contact pad. During the compressing step, the peripheral portion of the contact may move vertically downward toward the body of the interposer.

The stacking step of the above-described method may further include the step of stacking a plurality of circuit panels and at least one interposer, in an interweaved, vertically alternating arrangement. In such an arrangement, an interposer is disposed between each pair of circuit panels, with oppositely-directed first and second horizontal surfaces of each of the interposers confronting surfaces of the panels. The conductors of each of the interposers include through conductors extending through the body of the interposer and having their ends and contacts at or above first and second surfaces of the interposer. The contact pads on the plurality of panels are interconnected with one another by the through conductors.

The method may also include the step of bonding the contacts to the contact pads. The bonding step may include momentarily heating the stacked panels and interposers to activate electrically conductive bonding material that interfaces between the contacts and the vias. The bonding material may be carried on the contact pads. The momentary heating step may cause a softening of the body of the interposer, thereby facilitating vertical movement of the peripheral portions of the contacts during the compressing step.

The method may include the step of causing an adhesive such as a dielectric bonding material to flow at interfaces between the interposers and the panels during the compressing step so as to fuse the interposer and the panel into a substantially unitary mass. The step of causing the dielectric bonding material to flow may include momentarily heating the stacked panels and interposers.

Each contact of the interposer used in the method may include a plurality of tabs extending generally radially outward in a substantially symmetrical pattern from the associated conductor end. During the compressing step, each tab is bent so that a tip of each tab remote from the conductor moves downwardly toward the interposer body and horizontally toward the conductor end. All the tabs in each of the contacts may be engaged with the same contact pad during the stacking step.

In the method of the invention, the first surface of the interposer may be coated with an adhesive such as a pressure-sensitive adhesive. The adhesive is activated during the compressing step to bond the first surface of the interposer to the surface of the panel. Further, wiping of the peripheral portions of the contacts on the contact pads may cause at least some of the peripheral portions to be friction welded to corresponding ones of the contact pads.

In a method of making a circuit assembly according to another aspect of the invention, a circuit panel and an interposer are stacked in a vertically superposed arrangement so that a first horizontally extensive surface of the interposer confronts a first horizontally extensive surface of the circuit panel. A plurality of electrically conductive contacts on the first surface of the interposer confronts contact pads on the circuit panel. The contact pads face the interposer and define holes in the contact pads. The stacked panel and interposer are then pressed vertically so as to forcibly engage the contacts with the contact pads. The contacts are caused to deform so that at least a portion of each contact enters a hole defined by one of the contact pads and at least a portion of each contact engages the contact pad and moves horizontally inward and vertically downward with respect to the first surface of the interposer, thereby wiping the contact pad. The contacts may wipe the contact pads at edges defining the holes.

This process of the invention may further include the step of bonding each contact to the engaged contact pad. The bonding step may include the step of activating bonding material at interfaces between the contacts and the vias by momentarily heating the stacked interposer and circuit panel. The bonding material may be present on the contacts, the contact pads or both prior to the stacking step.

The interposer in this method may include a dielectric layer at the horizontally-extensive surface. The contact in that case includes a portion in contact with the dielectric layer and bearing on the engaged contact pad during the compressing step. The momentary heating softens the dielectric layer to facilitate vertical downward deformation of the contacts. The bonding may alternatively or additionally include compressing the stacked panel and the interposer so that portions of the contacts wipe the contact pads with sufficient force to friction weld the contacts to the engaged contact pads.

In a method of making a microelectronic interposer according to the invention, a body is provided having a first surface. A temporary layer is provided over the first surface of the body. Apertures passing through the body and the temporary layer are formed, and a layer of an electrically conductive structural material is deposited in each of the apertures and over the temporary layer proximate the aperture. The conductive structural material forms contacts on the temporary layer that extend into the apertures. The temporary layer is then removed, leaving the contacts with outwardly flaring peripheral portions that are spaced vertically above the first surface of the body.

An adhesive may be deposited on the first surface of the body before providing the first temporary layer. The temporary layer is then provided over the adhesive layer, and the adhesive layer is left exposed after the temporary layer is removed. The adhesive layer may be a thermoplastic or b-staged adhesive. In a preferred embodiment, the adhesive may be a material selected from the group of polyimide and polyetherimide (PEI). The temporary layer may be formed from a metal selected from a group consisting of aluminum, tin and nickel.

The body may also define a second surface opposite the first surface. In that case, the method further comprises providing a second temporary layer over the second surface, with the apertures passing through the second temporary layer, as well as the first temporary layer and the body. The electrically conductive structural material is deposited so as to extend over the second temporary layer proximate the apertures to thereby form second contacts.

In another method of making a microelectronic interposer according to the invention, a body defining the first surface is provided, and a first compliant layer is formed over the first surface. Apertures are then formed passing through the body and the compliant layer. A layer of an electrically conductive structural material is then deposited in each of the apertures and over the compliant layer proximate the aperture to form contacts with outwardly flaring peripheral portions on the compliant layer. The compliant layer may be an adhesive. The compliant layer may be partially etched so that the compliant layer has a thickness under the contacts greater than a thickness between the contacts.

DETAILED DESCRIPTION OF THE PREFERRED EMBODIMENTS

Figure 1:
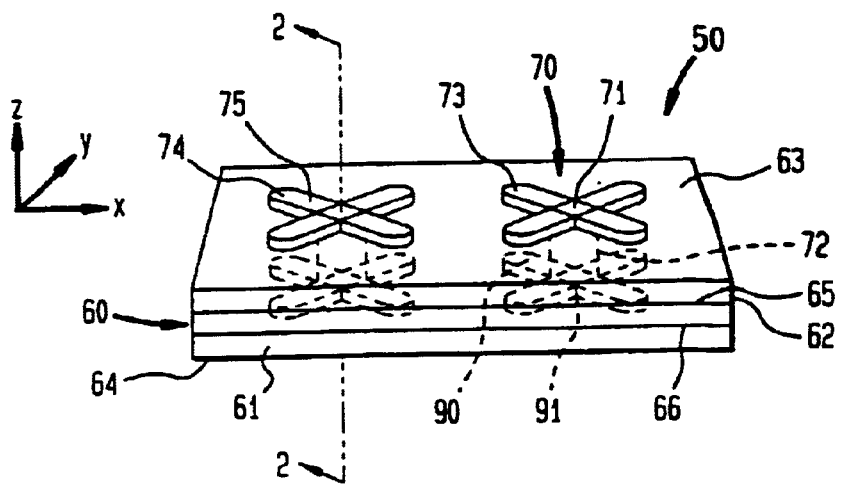
FIG. 1 is a fragmentary, diagrammatic perspective view depicting an interposer according to one embodiment of the invention.

An interposer according to one embodiment of the invention, shown in FIG. 1, has a body 60 with a first major surface 65. The body 60 may be formed of a dielectric material such as polyimide, or of another non-conducting material. The top surface 65 of the body 60 extends in horizontal directions; i.e., directions x, y as shown in FIG. 1. A plurality of conductors 72 extend vertically, or in the z direction, into the body. In the preferred embodiment shown in FIG. 1, the conductors 72 extend through the body 60. The conductors 72 may be elements formed by conductively plating vertical holes extending into the body 60 from the first surface 65. The conductors are formed of a structural conductive material such as copper, gold, tin or alloys thereof.

Each of the conductors 72 has a first end 71 positioned on or above the first major surface 65 of the body 60. Extending radially outward from the end 71 of the conductor is a contact 70. In the preferred embodiment shown in FIG. 1, the contact 70 comprises four substantially evenly spaced tabs 73. The contact 70 includes a periphery or peripheral portion 74 remote from the conductor, and a central portion 75 attached to the conductor 72.

A compliant layer 62 is formed on the first major surface 65 of the body, and lies between the body and the contacts 70. The compliant layer 62 is preferably an adhesive, such as a thermoplastic adhesive for adhering to a mating circuit panel as described below. The contacts 70 may rest directly on a top surface 63 of the compliant layer 62, or may be positioned above the top surface 63.

Figure 2:
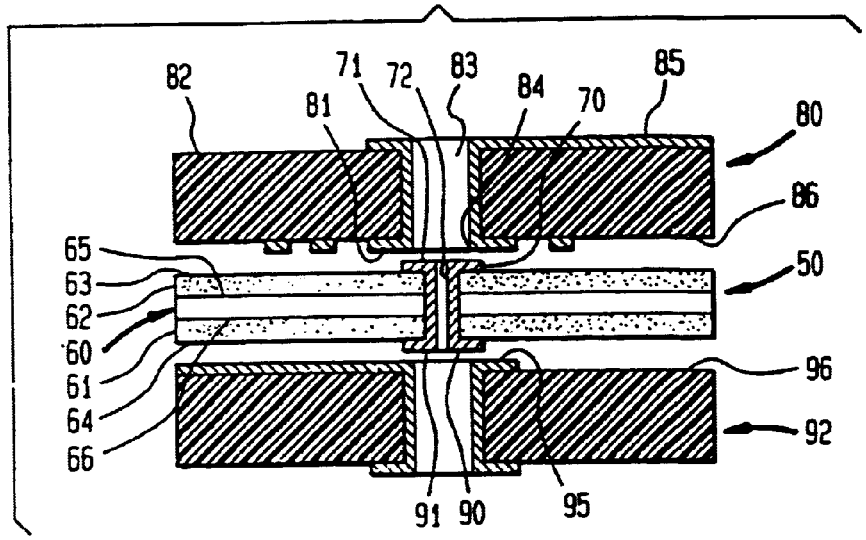
FIG. 2 is a fragmentary, diagrammatic sectional view taken through line II—II of FIG. 1 depicting an interposer according to one embodiment of the invention, together with two partial circuit panels for engagement therewith.

As best shown in FIGS. 1 and 2, the interposer body 60 of the present invention may further comprise a second major surface 66 opposite the first major surface 65, and facing in an opposite direction. The conductor 72 passes completely through the body 60 and has a second end 72 on or above the second major surface 66. The term "above," as used herein, refers to a direction away from the body on either side of the body, and is not necessarily related to the orientation of the body in space. The term "above" therefore refers to the different directions on different sides of the body.

A second contact 90 is attached to the conductor 72 at its second end 91. A second compliant layer 61 is formed on the second major surface 66, and the second contact 90 may be formed either on or above the surface 64 of the second compliant layer.

The interposer 50 of the invention is for making connections to a circuit board 80 (FIG. 2) having contact pads 81. The contact pads include a portion extending radially outwardly from a hole 83 in the circuit panel. The contact pads may further include a portion formed by plating the hole 83 with a conductive material. An edge 84 is formed by the contact pad at the periphery of the hole 83. In the contact pad shown in FIG. 2, the edge 84 is formed at the juncture of the portion of the pad extending radially outwardly from the hole and the portion plated within the hole. The circuit panel 80 also includes circuitry interconnecting the contact pads 81 with each other or with external wiring.

Figure 3:
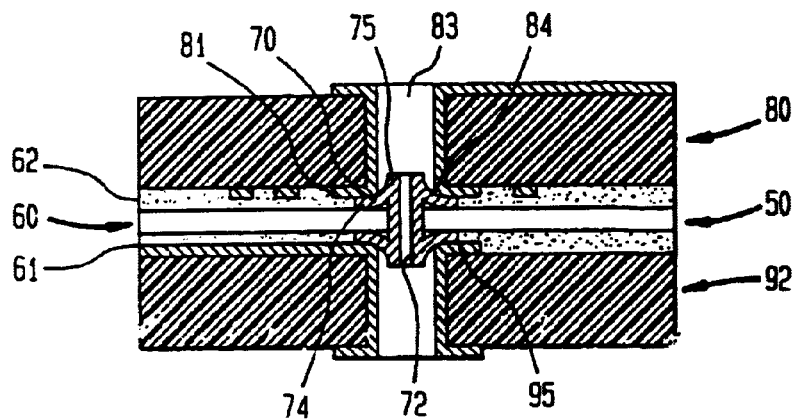
FIG. 3 is a fragmentary, diagrammatic sectional view of the interposer and circuit panels of FIG. 2 after engagement.

A method of making a multilayer circuit according to the invention using the interposer 50 is represented in FIGS. 2 and 3. The interposer is stacked with one or more circuit panels, such as circuit panel 80, so that the first surface 65 of the interposer body confronts a horizontally extensive surface 86 of the circuit panel. The compliant layer 62 is on the first major surface 65 of the interposer body and lies between the body and the horizontally extensive surface 86 of the circuit panel. The contacts 70 of the interposers confront the contact pads 81 on the circuit panel 80.

An additional circuit panel 92 may be stacked on the other side of the interposer 50, with horizontally extensive surface 96 of the circuit panel 92 confronting the second major surface 66 of the interposer body. The compliant layer 61 is on the second major surface 66 of the interposer body and lies between the body and the horizontally extensive surface 96 of the circuit panel 92. The contacts 90 of the interposer confront the contact pads 95.

The stacked panels and interposer are then compressed vertically, as shown in FIG. 3. The contacts 70, 90 are forcibly engaged with the contact pads 81, 95 of the circuit panels. The contacts deform so that the central portions 75 of the contacts enter the holes 83 defined by the contact pads. The peripheral portions 74 of the contacts have circumferences larger than the diameter of the holes 83, so that the peripheral portions engage the contact pads 81, 95 around the holes. As the interposer 50 and the circuit panels 80, 92 are forced together, the peripheral portions 74 are forced vertically downward, toward the body 60 of the interposer, wiping the contact pads. Wiping is concentrated at the edges 84 of the holes.

The compliant layer 62 permits the peripheral portion 74 of the contact to deform in a downward direction toward the body 60. The compliant layer 62 yields in response to the bending of the peripheral portion 74 toward the body 60.

As the contact 70 is forcibly engaged with the contact pad 81, frictional heat is developed, which, in a preferred embodiment, frictionally welds the contact to the contact pad. Such frictional welding creates highly reliable mechanical and electrical connections between the interposer and the circuit panel. Possible metallurgies of the contact and contact pad for use in this construction include, for example, gold-gold, gold-tin, gold-tin-lead, tin-tin-lead, tin-tin, gold-copper and copper-copper.

The base 60 of the interposer 50 must be sufficiently flexible to compensate for variations in planarity of the contact pads 81 of the circuit panel. Where no compliant layer such as layer 62 is used, the base must additionally be sufficiently deformable to permit deflection of the peripheral portions of the contacts into the base material. Examples of possible base interposer materials include a polyimide bondply, a reinforced B-staged material, thermoplastic films and insulated metal core materials.

In the embodiment of FIGS. 1–3, the layer 62 is a compliant layer that is also an adhesive. The adhesive may be pressure-activatable, in which case the circuit panel 80 is bonded to the interposer 50 during the step of pressing those two elements together.

The adhesive may alternatively be a heat-activatable adhesive. In that case, the assembly is heated after the interposer and the circuit panel are pressed together in order to activate the adhesive and bond the two elements together.

As show in FIG. 3, where a two-sided interposer is used, the circuit panel 80 and circuit panel 92 are electrically interconnected by the through-conductor 72 after assembly. The contacts 70, 90 are integral with the through conductor 72 and form a continuous electrical path between the contact pads 81 and the contact pads 95 of the two circuit panels. In a preferred embodiment, the through conductor, as well as the hole in which it was formed, extends perpendicular to the first major surface 65 of the body 60 of the interposer.

Figure 4:
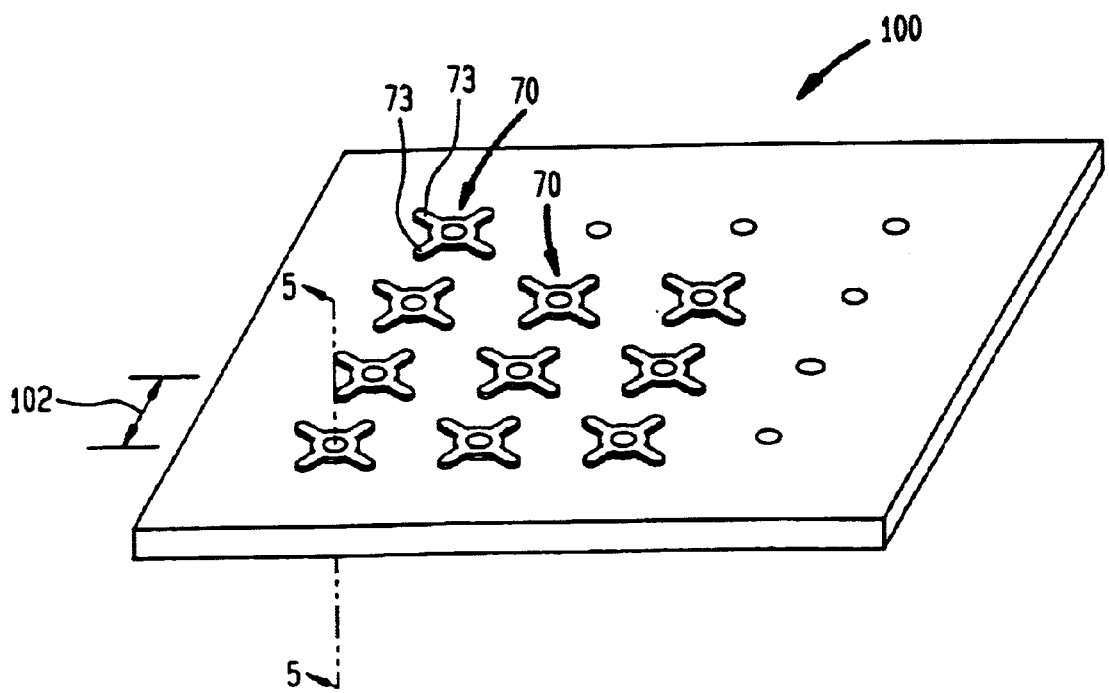
FIG. 4 is a diagrammatic, perspective view depicting an interposer according to one embodiment of the invention.

The interposer 100 according to one embodiment of the invention has an array of contacts 70 arranged in a rectilinear grid, as shown in FIG. 4. Each of the contacts 70 has a non-circular periphery including tabs 73. The tabs 73 are arranged in a symmetrical pattern about the contact 70; in the embodiment shown in FIG. 4, four tabs are arranged in a quatrefoil pattern. The tabs 73 extend from a central portion of the contact in a direction substantially diagonal to the rows and columns of the rectilinear grid.

In a presently preferred interposer according to the invention, the rectilinear grid of contacts 70 has a pitch 102 of approximately 1 mm (0.040 inches). The pitch is measured between similar features of adjacent contacts, such as a center-to-center distance. The interposer of the invention may be fabricated with pitches less than 1 mm in order to accommodate microelectronic components having greater contact densities. For example, an interposer having a contact grid array pitch of less than 1 mm is preferred; an interposer having a rectilinear array of contacts with a pitch of less than 0.75 mm (0.030 inches) is more preferred. An interposer having a contact pitch of less than 0.5 mm (0.020 inches) is most preferred.

Features within a contact array require process resolution considerably finer than the array pitch. For example, for an interposer having a contact pitch of 1 mm, holes in the circuit panels having a diameter of 0.4 mm (0.016 inches) are electroplated to 0.35 mm (0.014 inches) to form the central holes of the contact pads. Holes in the interposer having a diameter of 0.125 mm (0.005 inches) are electroplated to 0.1 mm (0.004 inches) to form the through conductors of the interposer. Contact arrays having finer pitches require proportionally smaller feature sizes and process resolutions.

Figure 5:
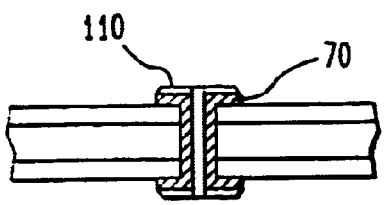
FIG. 5 is a fragmentary, diagrammatic sectional view of a contact of the interposer of FIG. 4, taken through line V—V.

A conductive bonding material 110 (FIG. 5) may be provided for bonding the contact 70 to the contact pad of the circuit panel. The conductive bonding material may be a solder, a brazing alloy, a defusion bonding alloy, a polymer impregnated with conductive materials, or another activatable conductive bonding material. While shown on the contact 70 in the illustrative embodiment, the bonding material 110 may instead be present on the contact pad of the circuit panel, or may be applied to both the contact 70 and the contact pad.

After compressing the interposer and the circuit panel so that the contact 70 is urged against a contact pad on the circuit panel, the bonding material 110 is activated to form an electrical and mechanical bond between the contact pad and the contact. Typically, the bonding material is activated by momentarily heating the assembly. In the case of flowable bonding material such as solder, the bonding material becomes temporarily flowable and wets the contact and contact pad. After cooling, the contact material resolidifies, forming a bond. Alternatively, momentary heating of the bonding material may cause chemical reactions, such as in the case of certain polymeric bonding materials and epoxy bonding materials.

The step of momentarily heating the assembly may not only activate the bonding material 110 between the contacts 70 and the contact pad of the circuit panel 10, but also activate the adhesive layers 61, 62 (FIGS. 2–3), forming a unitary structure including the interposer together with adjoining circuit panels. The step of momentarily heating the assembly may also soften the material immediately below the peripheral portion 74 of the contact (FIG. 3), permitting the contacts to deform downwardly toward the body 60 as well as inwardly toward the conductor 72 when the peripheral portion 74 is engaged with a contact pad.

Figure 6:
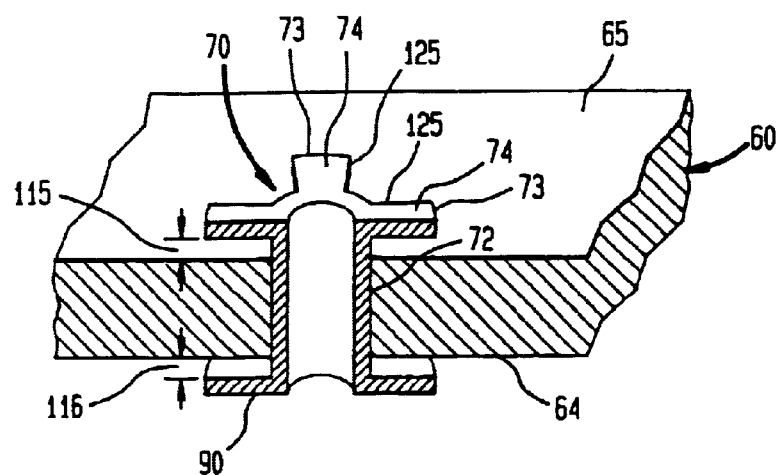
FIG. 6 is a diagrammatic, sectional, perspective view of a contact and associated portion of an interposer according to one embodiment of the invention.

A gap 115 (FIG. 6) may be formed between the contact 70 and the first surface 65 of the interposer body 60. A similar gap 116 may be formed between the opposite surface 64 of the body 60, and a second contact 90. While the gaps are shown between the contacts and the interposer body, similar gaps may be provided between the contacts and the compliant or adhesive layers, where such layers are used. The gaps 115, 116 provide clearance for deformation of the peripheral portions 74 of the contacts 70, 90 upon engagement with contact pads on circuit panels. By spacing the contacts above the surfaces of the interposer body, contact between the contacts and facing contact pads on the circuit panels is assured before the first surface 65 contacts the facing surface of the circuit panel. Furthermore, the gap 115 permits deformation of the periphery 74 of the contacts 70 without requiring a deformable material beneath the contacts 70. Thus, the body 60 need not necessarily be formed of a compressible or deformable material.

Figure 7:
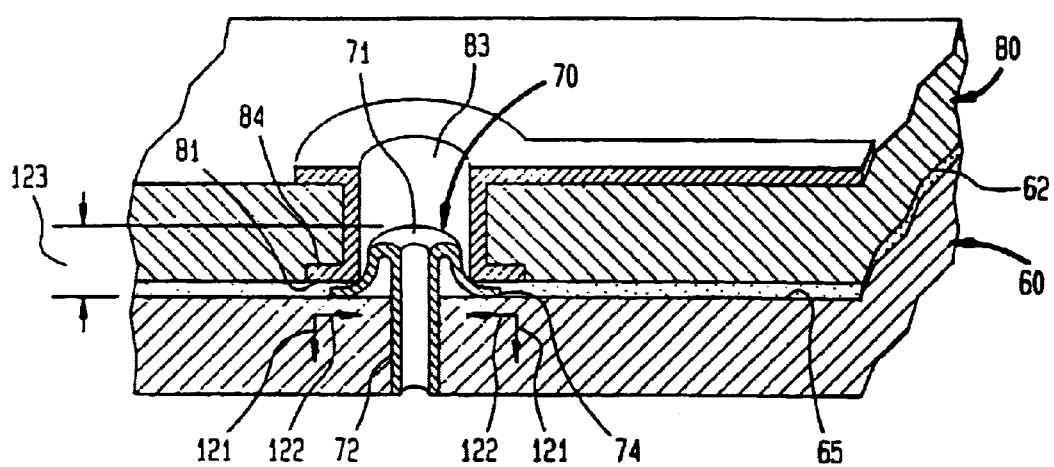
FIG. 7 is a diagrammatic, sectional, perspective view of a contact and associated portion of an interposer according to one embodiment of the invention, engaged with a corresponding contact pad of a circuit panel.

As the contact 70 deforms upon engagement with the contact pad 81, the peripheral portion 74 (FIG. 7) moves in a downward direction 121 toward the body 60 of the interposer, and in an inward direction 122 toward the conductor 72. During this movement, the edge 84 of the central hole 83 in the contact pad 81 wipes along the surface of the contact 70, breaking through oxidation layers to form a metal-to-metal contact between the contact pad 81 and the contact 70. The wiping action may further induce friction welding or "cold" welding between those two components, forming a permanent mechanical bond. If an adhesive or other compliant layer 62 is present, that layer is deformed in the area around the peripheral region of the contact, as the contact is deformed downward and inward.

The substantially cylindrical conductor 72 is attached to the body 60 of the interposer and has sufficient rigidity so as to remain substantially undeformed during the engagement process. Thus, a vertical position 123 of the first end 71 of the conductor with respect to the first surface 65 of the interposer body remains substantially unchanged during the engagement. The first end 71 of the conductor 72 thereby enters the hole 83, dragging the peripheral portion 74 of the contact 70 across the edge 84 of the hole.

Where the contact 70 comprises a plurality of tabs such as tabs 73 (FIG. 6), forces between the tabs and the edge 84 of the contact pad hole are concentrated at the edges 125 of the tabs. The edges 125 of the tabs therefore wipe the edge 84 of the contact pad hole with relatively great force, removing oxide layers in that area and promoting cold welding.

To prevent the conductor 72 from collapsing during engagement of the contacts 70 with the contact pads 81, the conductor 72 may have an increased wall thickness as compared to the contact 70. Further, the closed cylindrical shape of the conductor 72 creates a column-like structure that is resistant to compressive forces during contact engagement. Other shapes known to be resistant to compressive column loads, such as a triangular box beam, may be used.

Figure 8:
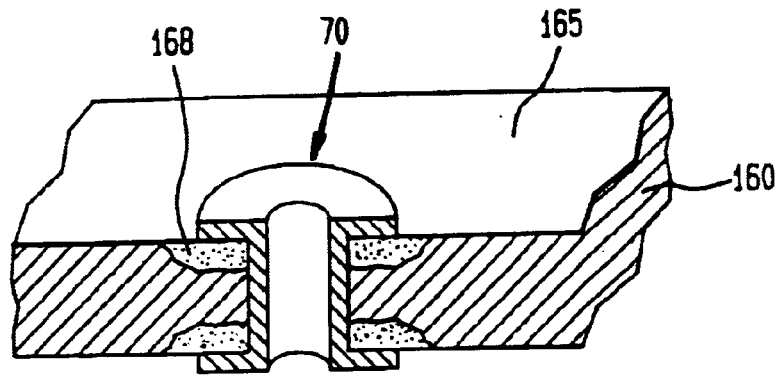
FIGS. 8–10 are a diagrammatic, sectional, perspective views of contacts and associated portions of interposers according to various embodiments of the invention.

The contact 70 may be formed directly on a primary surface 165 of an interposer body 160 (FIG. 8). In that case, the interposer body 160 must be deformable in order to permit the contacts 70 to deform downwardly and inwardly upon engagement with opposing contact pads. While an entire interposer body may be fabricated from a uniformly compliant material, such an approach is not practical with certain materials because of the strength requirement of the interposer in areas between contacts. Another solution is to provide a compliant region 168 in the interposer 160 in a local area beneath the contact 70. Such a region may be formed by using an initially b-staged material for forming the body 160, then forming the contacts on the body and finally curing the body 160 in all areas other than those beneath the contacts 170. Such selective curing may be done by radiation curing with a mask (not shown) blocking the areas around the contacts, or by using the contacts 170 themselves as a mask during curing.

Figure 9:
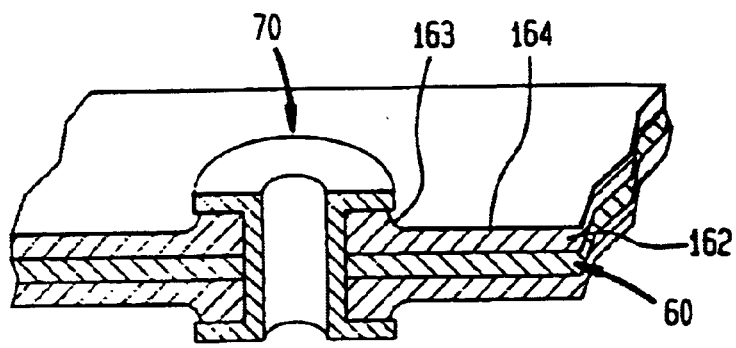

The thickness of an adhesive layer 162 (FIG. 9) may be increased in the area surrounding the contact 70 in order to provide support for the contact during transport and handling of the interposer. In that case, the compliant layer 162 comprises a region of smaller thickness 164 in an area remote from contacts 70 and a region of increased thickness 163 directly beneath the contacts 70. The region 163 provides support for the contact during handling. The area of decreased thickness 164 permits the contact 70 to contact the contact pads of the circuit panel, and assure complete contact before the top surface of the adhesive or compliant layer 162 contacts the facing surface of the circuit panel. Where no adhesive or other compliant layer is used, the interposer body itself may have areas of reduced thickness in regions between contacts. In either case, the regions of reduced thickness may be formed using a plasma etching process, wherein the contact itself acts as a mask, preventing etching of the material directly below.

Figure 10:
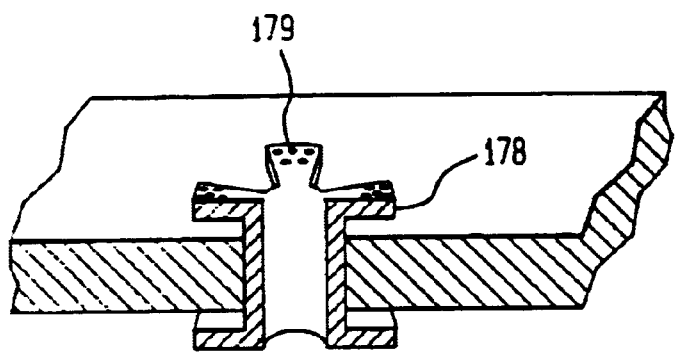

Contact tabs 178 (FIG. 10) may be provided with asperities 179 on their upper surfaces in order to enhance wiping action between the tabs and the mating contact pads on the circuit panels. The asperities may be formed by selectively etching the top surfaces of the tabs. In an alternative embodiment, the asperities may be provided on the facing surfaces of the contact pads. In either case, the asperities break through the oxidation layers on the opposing surfaces, forming metal-to-metal contact.

The contacts of the present invention are highly tolerant of size and/or positional errors in the contacts themselves and in mating contact pads. For example, as shown schematically in FIG. 11, a contact 270 having tabs 273 may be used with a contact pad having a large hole-size tolerance, represented by circles 280, 281. The edge formed by either hole 280, 281 is wiped by the four tabs 273 during engagement, removing oxidation and forming a metal-to-metal contact. Thus, contact engagement is not excessively affected by hole size.

Figure 12:
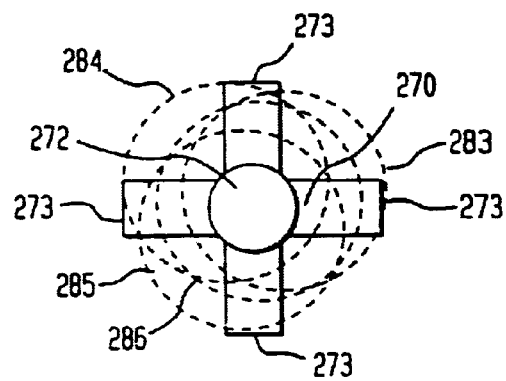
FIG. 12 is a schematic plan view of a contact of an interposer according to the invention, showing its relative location with respect to a hole of a mating contact pad of a circuit panel.

Contact engagement according to the invention is also robust with regard to positional tolerances affecting the relative positions of the contact and the corresponding contact pad. As shown in FIG. 12, a contact 270 having four tabs 273 may effectively engage contact pads with a wide range of positions, represented by holes 283–286. While positional deviation will result in some tabs 273 being deformed to a greater degree than others in a single contact, the design permits variations in relative position without substantially affecting the overall mechanical and electrical performance of the joint.

Figure 11:
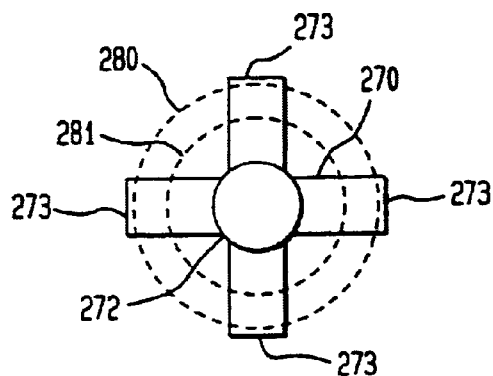
FIG. 11 is a schematic plan view of a contact of an interposer according to the invention, showing its size relative to a hole of a mating contact pad of a circuit panel.
Figure 13A:
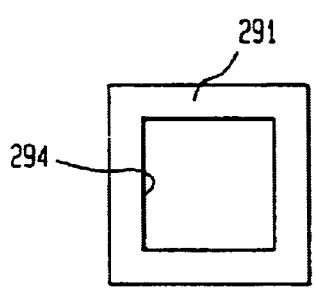
FIGS. 13A–13C are schematic plan views, respectively, of a contact pad on a circuit panel, a corresponding contact on an interposer and the contact and contact pad in a superposed position, according to the invention.
Figure 13B:
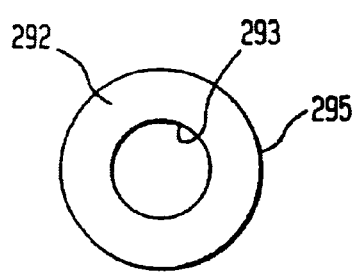

A contact pad 291 (FIG. 13A) of a circuit panel may have a polygonal hole, such as square hole 294. Such a hole presents multiple surfaces for wiping the contact as it is inserted. A contact 292 (FIG. 13B) having a circular periphery 295 may be used in conjunction with the square hole 294. A conductor connected to the central portion 293 has a sufficiently small diameter to clear the square hole 294, given positional and size tolerances as illustrated in FIGS. 11 and 12.

Figure 13C:
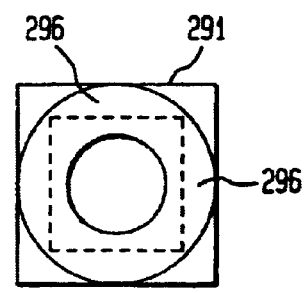

The relative sizes of the periphery 295 of the contact and the square hole 294 of the contact pad 291 are selected so as to contact a plurality of substantially separate edge portions 296 (FIG. 13C) of the contact 292. It is believed that the edge portions "fold" downward and inward as the contact and contact pad engage. That configuration permits the use of the circular periphery 295 without resulting in excessive engagement forces. In contrast, full engagement around the periphery of a circular contact does not permit "folding" of such edge portions, and thus results in high engagement forces. A circular contact periphery 295 is desirable in the manufacture of smaller pitch sizes, because of the limitations in the photolithographic process.

Figure 14:
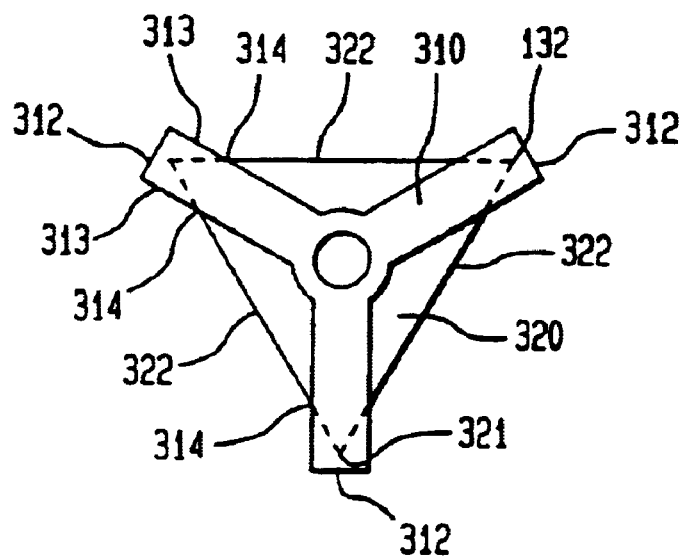
FIG. 14 is a schematic plan view of a contact of an interposer according to another embodiment of the invention shown superposed over a hole of a contact pad.

A tabbed contact 310 (FIG. 14) may also be used in conjunction with a polygonal hole 320 in a contact pad. For example, a contact having three tabs 312 may be inserted in a triangular hole 320 having edges 322 forming vertices 321. In this case, the tabs 312 are aligned with the vertices 321, forming two primary contact points 314 on each tab 312 between the tab edges 313 and the edges 322 of the triangular hole. Localized contact at the contact points 314 results in high contact stresses with increased wiping and increased cold welding.

Figure 15:
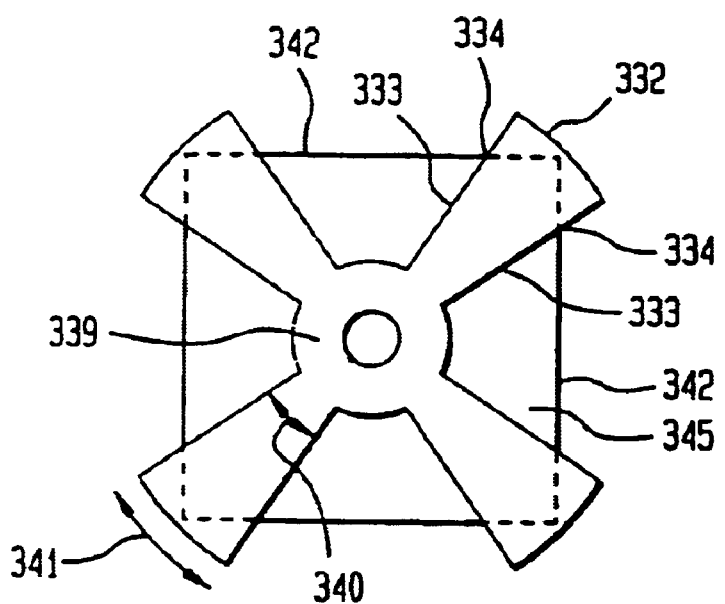
FIG. 15 is a schematic plan view of a contact of an interposer according to another embodiment of the invention shown superposed over a hole of a contact pad.

In another aspect of the invention, the tabs 332 (FIG. 15) may have a circumferential width 341 near the tips that is greater than the circumferential width 340 near the central portion 339. In that case, the contact points 334 between the tab edges 333 and the edges 342 of the contact pad hole 345 move along the contact pad hole edges 342 as the contact is inserted into the hole. Such a configuration increases the total wiped area available for electrical and mechanical bonding.

Figure 16A:
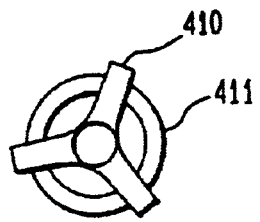
FIGS. 16A–16J are schematic plan views of contacts of interposers according to various embodiments of the invention, shown together with corresponding contact pads of circuit panels.
Figure 16B:
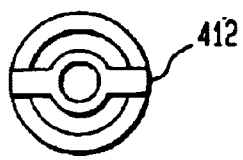
Figure 16C:
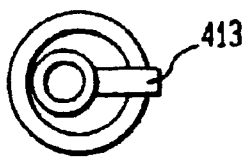
Figure 16D:
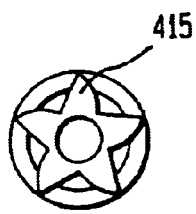
Figure 16E:
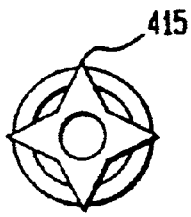
Figure 16F:
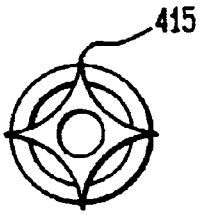
Figure 16G:
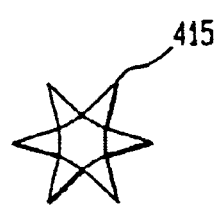

The photolithographic process used in forming the contacts may be used to create a wide variety of contact geometries. For example, as shown in FIGS. 16A–16C, the number of tabs in a multiple-tabbed configuration may be reduced to form a three-tabbed contact 410, a two-tabbed contact 412 or a one-tabbed contact 413. A reduced number of tabs requires less resolution in the photolithographic process by permitting the formation of wider tabs, which are less likely to be lost during imaging.

Figure 16H:
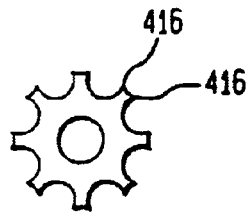

Star-shaped configurations, such as those shown in FIGS. 16D–16G, have points 415 on the tips of the tabs. Where the contact is completely pressed into the hole in the contact pad, the points 415 scrape the inside wall of the hole, improving the mechanical and electrical connection. The scraping of the tips of the tabs within a contact pad hole may be enhanced by providing multiple points 416 (FIG. 16H) on the tabs. Furthermore, the relatively large number of tabs in a star-shaped configuration provide multiple conductive pathways between the contact and the contact pad. Such multiple pathways make the joints less sensitive to the loss of tabs in the photolithographic process, as well to defective joints between a tab and the mating contact pad.

Figure 16I:
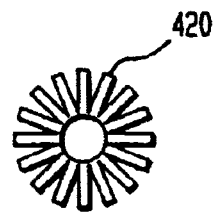
Figure 16J:
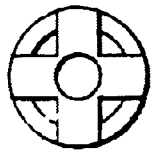

A contact 420 (FIG. 16I) having a large number of tabs provides a large number of electrical paths between the contact and the contact pad. Such a contact may form a substantially continuous conical shape upon insertion into a contact pad hole, providing the maximum cross-sectional conductive area between the interposer and the circuit panel.

Figure 17A:
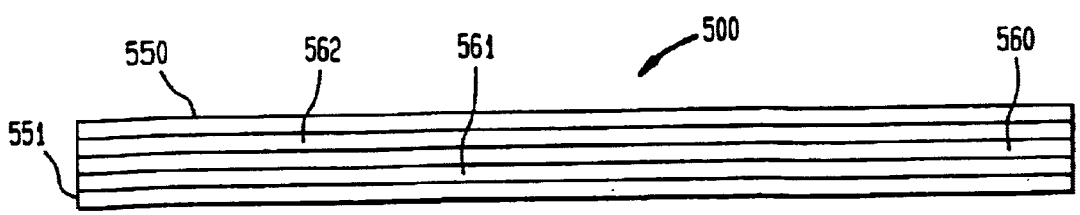
FIGS. 17A–17E are fragmentary, diagrammatic, sectional views depicting a portion of an interposer during various stages of a fabrication process according to one embodiment of the invention.

In a process for forming an interposer according to the invention, an initial laminate is first formed. A polyimide body 560 (FIG. 17A) is first coated with a compliant adhesive 561, 562. The adhesive may be a thermoplastic or b-staged adhesive, and is preferably a thermoplastic. In a most preferred embodiment, the adhesive is selected from the group consisting of polyetherimide (PEI) and polyimide. In the preferred embodiment shown, the adhesive is applied to both surfaces of the body 560. The adhesive may be applied by transfer lamination, or by mechanically or chemically coating the polyimide sheet with a layer of adhesive.

Sacrificial metallic layers 550, 551 are next applied to the exposed surfaces of the adhesive. The metallic layers are formed of a material selected to be chemically removable without removing the contacts and conductors formed later in the process. For example, a preferred sacrificial layer material is aluminum.

Figure 17B:
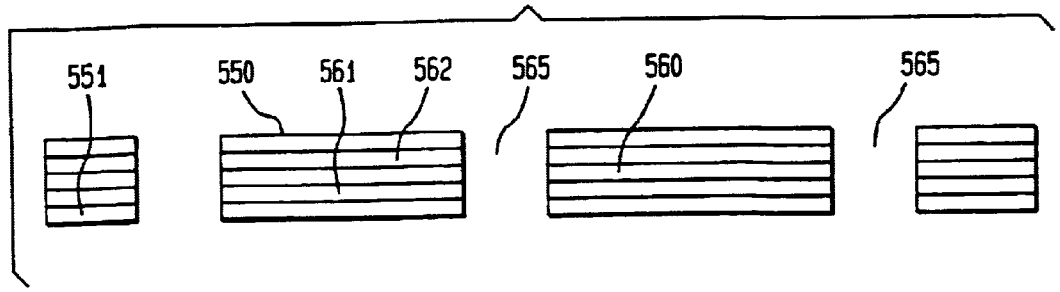

Through holes 565 (FIG. 17B) are next formed in the resulting laminate. The through holes may be drilled, such as by laser ablation, or may be punched or otherwise formed in the laminate. The holes extend completely through the base layer 560, the adhesive layers 561, 562 and the sacrificial layers 550, 551.

Figure 17C:
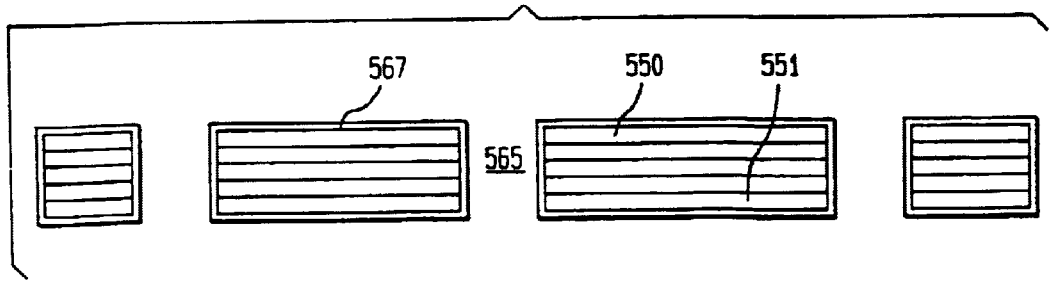

The entire assembly is next sputter metalized to form a flash metallic layer 567 (FIG. 17C). The flash metallic layer 567 is preferably gold, but may alternatively be tin, copper or another metal compatible with the materials used in the contact and conductor-forming processes. The metalization process forms a layer on the exposed surfaces of the sacrificial layer 550, 551, as well as within the holes 565.

Figure 17D:
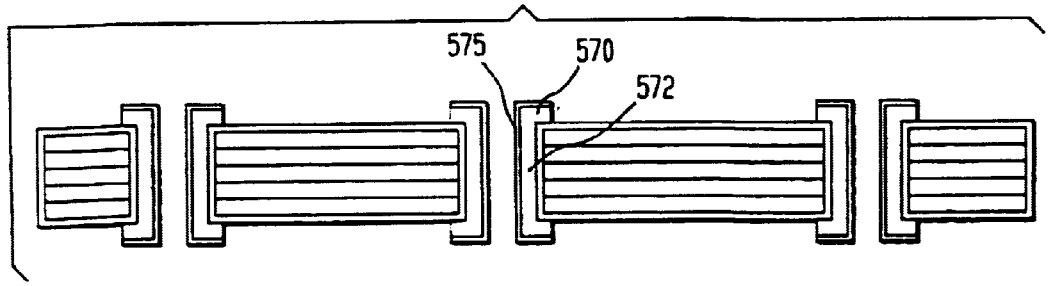
Figure 17E:
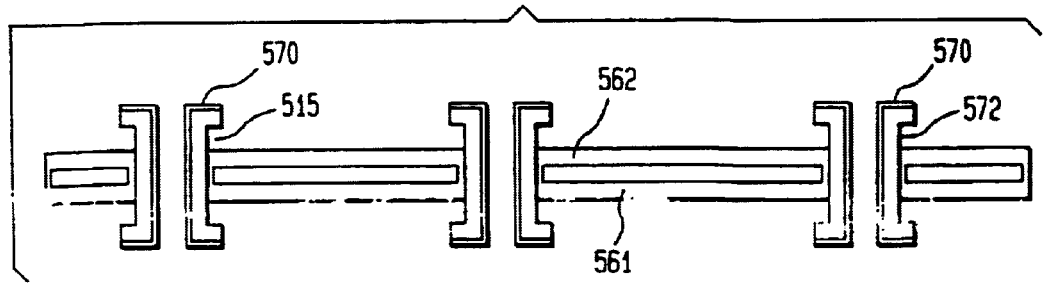

The contacts 570 and conductors 572 (FIG. 17D) are next formed in the holes. The contacts and conductors are preferably formed integrally by first forming patterned photoresist layers (not shown) defining the outer periphery of the contacts on the flash coated outer surfaces of the sacrificial layers 550, 551. The contacts 570, 572 are then formed by electroplating the contact material onto the areas not covered with photoresist. The contact material is then plated with a gold or tin finish layer 575, and the photoresist pattern layers are removed.

The sacrificial aluminum layers 550, 551 are then removed using an etchant that leaves the contacts 570 and conductors 572 substantially intact. The removal of the sacrificial layers leaves a gap 515 between the contact 570 and the adhesive layer 562. That gap permits deformation of the contact 570 upon engagement with a contact pad on a mating circuit panel. Because the contacts 570 are spaced away from the outer surface of the adhesive 562, full engagement of the contacts with contact pads is assured before engagement of the adhesive 562 with the facing surface of the circuit panel.

The above method of fabricating an interposer according to the invention may be performed without applying a sacrificial layer on the adhesive. In that case, the contacts are formed directly over the adhesive layer. The adhesive layer is formed of a material selected to be compliant in order to permit the contact 570 to deflect downward and inward into the adhesive layer. Furthermore, while the method was described as including an adhesive layer, that layer may be replaced by another compliant layer that does not necessarily adhere to the circuit panel. Furthermore, the compliant layer or adhesive layer may be completely eliminated, either forming the contact 570 spaced away from the body 560 to permit deformation, or using an at least locally compliant body 560 to permit deformation of the contacts into the body.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A circuit assembly comprising an interposer and a first circuit panel having contact pads defining holes, a first surface of said interposer confronting a surface of said panel, said interposer having a body defining said first surface and conductors having ends adjacent or above said first surface and having a contact at each said conductor end, each said contact including a peripheral portion extending generally horizontally from the associated conductor end, said peripheral portions of said contacts confronting the contact pads on the first circuit panel facing said interposer, said conductor ends received within said holes defined by said contact pads, said peripheral portions of said contacts being engaged with said contact pads whereby the peripheral portion of each contact has contracted radially inwardly toward the associated conductor end so that each said peripheral portion has moved horizontally with respect to the engaged contact pad and has wiped said contact pad.

2. The circuit assembly as claimed in claim 1, wherein each said contact bends vertically so that the periphery of the contact moves towards the body, as well as contracting radially inwardly toward a central portion of the contact.

3. The circuit assembly as claimed in claim 1, wherein the periphery of each said contact is noncircular.

4. The circuit assembly as claimed in claim 1, wherein each said contact is formed integrally with the associated conductor.

5. The circuit assembly as claimed in claim 1, wherein said conductors are arranged at a pitch of less than about 1.0 mm, from center to center.

6. The circuit assembly as claimed in claim 1, wherein said body defines a second surface facing in an opposite direction from said first surface, at least some of said conductors being through conductors having first ends disposed adjacent said first surface and second ends disposed adjacent said second surface, at least some of said contacts being permanently joined to said first ends of said through conductors, the interposer further including second end contacts on or above said second surface permanently joined to said second ends of said through conductors; each said second end contact extending radially outwardly from the associated conductor, each said second end contact having a periphery remote from the conductor; each said second end contact being adapted to deform so that the periphery of the contact will contract radially inwardly toward the central portion of the contact in response to urging said periphery of the contact against a contact pad of a second circuit panel and inserting the central portion of the contact into a hole defined by the contact pad; whereby said contacts will wipe the contact pads of the second circuit panel when the second circuit panel is juxtaposed with said second surface and forced toward said body.

7. The circuit assembly as claimed in claim 2, wherein the periphery of each said contact is spaced vertically above said body, with a gap between the periphery of said contact and said body.

8. The circuit assembly as claimed in claim 2, wherein said body is deformable at least near the periphery of each said contact, whereby said movement of said periphery toward said body causes said periphery to engage and deform said body.

9. The circuit assembly as claimed in claim 2, wherein said body further comprises an adhesive layer on said first surface for adhering said interposer to said circuit panel.

10. The circuit assembly as claimed in claim 3, wherein each said contact includes a plurality of tabs extending radially outwardly away from the conductor, each said tab having a tip remote from the conductor.

11. The circuit assembly as claimed in claim 4, wherein each said conductor extends substantially perpendicularly to said first surface.

12. The circuit assembly as claimed in claim 9, wherein said contacts are disposed on said adhesive layer.

13. The circuit assembly as claimed in claim 10, wherein said tabs of each said contact are disposed in a substantially symmetrical pattern about the juncture of the contact and the associated conductor.

14. The circuit assembly as claimed in claim 10, wherein said tabs are disposed in a star pattern with tips of said tabs having a circumferential width less than a circumferential width of said tabs near a central portion of said conductor.

15. The circuit assembly as claimed in claim 10, wherein a circumferential width of said tabs near said tips is greater than a circumferential width of said tabs near said central portion.

16. The circuit assembly as claimed in claim 10, wherein each said contact includes a conductive bonding material adapted to facilitate electrical joining of said tabs to contact pads engaged therewith.

17. The circuit assembly as claimed in claim 12, wherein said adhesive layer has a thickness beneath said contacts greater than a thickness of said adhesive layer between said contacts.

18. The circuit assembly as claimed in claim 13, wherein each said contact includes four said tabs, and said substantially symmetrical pattern is a quatrefoil pattern.

19. The circuit assembly as claimed in claim 16, wherein said conductive bonding material is selected from the group consisting of solders, brazing alloys, diffusion bonding alloys and conductive materials incorporating a polymer.

20. The circuit assembly as claimed in claim 18, wherein said contacts are disposed in a substantially rectilinear grid having rows and columns, and wherein said tabs extend substantially diagonally with respect to said rows and columns.

21. A circuit assembly comprising an interposer having a plurality of electrically conductive contacts on a first surface thereof, a first circuit panel having contact pads defining holes, said first circuit panel and said interposer stacked in vertically superposed arrangement so that a first horizontally-extensive surface of said interposer confronts a first horizontally-extensive surface of the circuit panel and so that said plurality of electrically conductive contacts on said first surface of said interposer confront the contact pads on the circuit panel facing said interposer forming a stacked panel; and said stacked panel being vertically compressed so as to forcibly engage said contacts with said contact pads whereby said contacts are deformed so that at least a portion of each contact is received within a hole defined by one of said contact pads and at least a portion of each contact engaged with a contact pad has moved horizontally inward and vertically downward with respect to the first surface of the interposer for wiping the contact pad.

22. The circuit assembly as claimed in claim 21, wherein each said contact bends vertically so that the contact moves towards said first surface, as well as contracting radially inwardly toward a central portion of the contact.

23. The circuit assembly as claimed in claim 21, wherein each said contact is noncircular.

24. The circuit assembly as claimed in claim 21, wherein each said contact includes a conductor extending through said interposer substantially perpendicularly to said first surface.

25. The circuit assembly as claimed in claim 21, wherein said contacts are arranged at a pitch of less than about 1.0 mm, from center to center.

26. The circuit assembly as claimed in claim 21, wherein said interposer includes a second surface facing in an opposite direction from said first surface, said interposer further including second contacts on or above said second surface; each said second contact extending radially outwardly and having a periphery; each said second contact being adapted to deform so that the periphery of the contact will contract radially inwardly toward a central portion of the contact in response to urging said periphery of the contact against a contact pad of a second circuit panel and inserting a central portion of the contact into a hole defined by the contact pad; whereby said contacts will wipe the contact pads of the second circuit panel when the second circuit panel is juxtaposed with said second surface and forced toward said interposer.

27. The circuit assembly as claimed in claim 22, wherein a peripheral portion of each said contact is spaced vertically above said first surface, with a gap between the periphery of said contact and said first surface.

28. The circuit assembly as claimed in claim 22, wherein said interposer further includes an adhesive layer on said surface for adhering said interposer to said circuit panel.

29. The circuit assembly as claimed in claim 23, wherein each said contact includes a plurality of tabs extending radially outwardly, each said tab having a tip.

30. The circuit assembly as claimed in claim 27, wherein said interposer is deformable at least near the periphery of each said contact, whereby said movement of said periphery toward said first surface causes said periphery to engage and deform said interposer.

31. The circuit assembly as claimed in claim 28, wherein said contacts are disposed on said adhesive layer.

32. The circuit assembly as claimed in claim 29, wherein said tabs of each said contact are disposed in a substantially symmetrical pattern.

33. The circuit assembly as claimed in claim 29, wherein said tabs are disposed in a star pattern with said tips of said tabs having a circumferential width less than a circumferential width of said tabs near a central portion of said contacts.

34. The circuit assembly as claimed in claim 29, wherein a circumferential width of said tabs near said tips is greater than a circumferential width of said tabs near a central portion of said contacts.

35. The circuit assembly as claimed in claim 29, wherein each said contact includes a conductive bonding material adapted to facilitate electrical joining of said tabs to contact pads engaged therewith.

36. The circuit assembly as claimed in claim 31, wherein said adhesive layer has a thickness beneath said contacts greater than a thickness of said adhesive layer between said contacts.

37. The circuit assembly as claimed in claim 32, wherein each said contact includes four said tabs, and said substantially symmetrical pattern is a quatrefoil pattern.

38. The circuit assembly as claimed in claim 35, wherein said conductive bonding material is selected from the group consisting of solders, brazing alloys, diffusion bonding alloys and conductive materials incorporating a polymer.

39. The circuit assembly as claimed in claim 37, wherein said contacts are disposed in a substantially rectilinear grid having rows and columns, and wherein said tabs extend substantially diagonally with respect to said rows and columns.

40. A multilayer circuit assembly comprising at least one interposer having a body defining first and second surfaces, said interposer including a plurality of conductors each having a conductor end adjacent or above said first surface and having a contact at each said conductor end, each said contact including a peripheral portion extending generally horizontally from the associated conductor end; at least one circuit panel having contact pads defining holes therein; said circuit panel and said interposer being stacked so that said first surface of said interposer confronts a surface of said panel and said peripheral portions of said contacts confront said contact pads on the circuit panel facing said interposer; and said circuit panel and said interposer compressed together such that said conductor ends have entered said holes defined by said contact pads, and said peripheral portions of said contacts have forcibly engaged said contact pads whereby said peripheral portion of each contact has contracted radially inwardly toward the associated conductor end so that each said peripheral portion has moved horizontally with respect to the engaged contact pad for wiping said contact pad.

41. The multilayer circuit assembly as claimed in claim 40, wherein each said contact bends vertically so that the periphery of the contact moves towards the body, as well as contracting radially inwardly toward a central portion of the contact.

42. The multilayer circuit assembly as claimed in claim 40, wherein the periphery of each said contact is noncircular.

43. The multilayer circuit assembly as claimed in claim 40, wherein each said contact is formed integrally with the associated conductor.

44. The multilayer circuit assembly as claimed in claim 40, wherein said conductors are arranged at a pitch of less than about 1.0 mm, from center to center.

45. The multilayer circuit assembly as claimed in claim 40, wherein said body defines said second surface facing in an opposite direction from said first surface, at least some of said conductors being through conductors having first ends disposed adjacent said first surface and second ends disposed adjacent said second surface, at least some of said contacts being permanently joined to said first ends of said through conductors, the interposer further including second end contacts on or above said second surface permanently joined to said second ends of said through conductors; each said second end contact extending radially outwardly from the associated conductor, each said second end contact having a periphery remote from the conductor; each said second end contact being adapted to deform so that the periphery of the contact will contract radially inwardly toward the central portion of the contact in response to urging said periphery of the contact against a contact pad of a second circuit panel and inserting the central portion of the contact into a hole defined by the contact pad; whereby said contacts will wipe the contact pads of the second circuit panel when the second microelectronic element is juxtaposed with said second surface and forced toward said body.

46. The multilayer circuit assembly as claimed in claim 41, wherein the periphery of each said contact is spaced vertically above said body, with a gap between the periphery of said contact and said body.

47. The multilayer circuit assembly as claimed in claim 41, wherein said body is deformable at least near the periphery of each said contact, whereby said movement of said periphery toward said body causes said periphery to engage and deform said body.

48. The multilayer circuit assembly as claimed in claim 41, wherein said body further comprises an adhesive layer on said first surface for adhering said interposer to said circuit panel.

49. The circuit assembly as claimed in claim 42, wherein each said contact includes a plurality of tabs extending radially outwardly away from the conductor, each said tab having a tip remote from the conductor.

50. The multilayer circuit assembly as claimed in claim 43, wherein each said conductor extends substantially perpendicularly to said first surface.

51. The multilayer circuit assembly as claimed in claim 48, wherein said contacts are disposed on said adhesive layer.

52. The multilayer circuit assembly as claimed in claim 49, wherein said tabs of each said contact are disposed in a substantially symmetrical pattern about the juncture of the contact and the associated conductor.

53. The multilayer circuit assembly as claimed in claim 49, wherein a circumferential width of said tabs near said tips is greater than a circumferential width of said tabs near said central portion.

54. The multilayer circuit assembly as claimed in claim 49, wherein each said contact includes a conductive bonding material adapted to facilitate electrical joining of said tabs to contact pads engaged therewith.

55. The multilayer circuit assembly as claimed in claim 51, wherein said adhesive layer has a thickness beneath said contacts greater than a thickness of said adhesive layer between said contacts.

56. The multilayer circuit assembly as claimed in claim 52, wherein each said contact includes four said tabs, and said substantially symmetrical pattern is a quatrefoil pattern.

57. The multilayer circuit assembly as claimed in claim 52, wherein said tabs are disposed in a star pattern with tips of said tabs having a circumferential width less than a circumferential width of said tabs near a central portion of said conductor.

58. The multilayer circuit assembly as claimed in claim 54, wherein said conductive bonding material is selected from the group consisting of solders, brazing alloys, diffusion bonding alloys and conductive materials incorporating a polymer.

59. The multilayer circuit assembly as claimed in claim 56, wherein said contacts are disposed in a substantially rectilinear grid having rows and columns, and wherein said tabs extend substantially diagonally with respect to said rows and columns.

* * * * *